(12) United States Patent
Brown

(10) Patent No.: US 6,519,177 B1
(45) Date of Patent: Feb. 11, 2003

(54) CIRCUITS AND METHODS FOR INITIALIZING MEMORY CELLS

(75) Inventor: James Robert Brown, Idaho Falls, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/016,163

(22) Filed: Dec. 10, 2001

(51) Int. Cl.[7] ............................................... G11C 11/40
(52) U.S. Cl. ...................................... 365/154; 365/156
(58) Field of Search ................................ 365/154, 156, 365/149, 150

(56) References Cited

U.S. PATENT DOCUMENTS

| | | | | |
|---|---|---|---|---|
| 4,777,623 A | * | 10/1988 | Shimazu et al. ............ | 365/154 |
| 5,027,319 A | | 6/1991 | Lai .............................. | 365/156 |
| 5,325,325 A | * | 6/1994 | Azuma ........................ | 365/156 |
| 5,828,597 A | | 10/1998 | Madan ........................ | 365/156 |
| 5,841,726 A | * | 11/1998 | Williams et al. ........ | 365/230.03 |
| 6,058,041 A | | 5/2000 | Golke et al. ................. | 365/156 |
| 6,160,275 A | | 12/2000 | Nishio et al. ............... | 257/206 |

\* cited by examiner

Primary Examiner—Tan T. Nguyen
(74) Attorney, Agent, or Firm—Workman, Nydegger & Seeley

(57) ABSTRACT

A memory initialization circuit includes one or more duplicated pairs of bit lines, which may be used to initialize the memory cells of a memory array to different logical values. When an initialization signal is asserted on the initialization circuit, the individual bit lines in the pair of bit lines are set to opposite logical values, for instance setting one bit line to a logical zero and the other to a logical one. This occurs without regard to external data values received by the circuit. When the initialization signal is removed, individual bit lines in a duplicated pair carry identical values, which may be equal to external data values that are received by the circuit. Thus, after initialization, memory cells function as if duplicated pairs were not included in the circuit. A memory array may be initialized to a predetermined pattern by coupling different combinations of memory cells to different bit lines from duplicated pairs.

16 Claims, 7 Drawing Sheets

| Operation | From Figures 4A & 4B | | | | From Figures 3, 4A & 4B | | | | | | | | From Figure 3 | | | |
|---|---|---|---|---|---|---|---|---|---|---|---|---|---|---|---|---|
| | INIT | WE | CA | DATA | PB0 | NB0 | PB1 | NB1 | PBN0 | NBN0 | PBN1 | NBN1 | Bit Line A | Bit Line B | Bit Line C | Bit Line D |
| Read M | 0 | 0 | X | X | 1 | 0 | 1 | 0 | 1 | 0 | 1 | 0 | M | M | MN | MN |
| Read M | 0 | X | X | X | 1 | 0 | 1 | 0 | 1 | 0 | 1 | 0 | M | M | MN | MN |
| Write 0 | 0 | 1 | 1 | 0 | 0 | 1 | 1 | 1 | 0 | 1 | 0 | 0 | 0 | 0 | 1 | 1 |
| Write 1 | 0 | 1 | 1 | 1 | 1 | 0 | 0 | 1 | 1 | 0 | 1 | 1 | 1 | 1 | 0 | 0 |
| Initialize | 1 | X | X | X | 1 | 1 | 1 | 0 | 0 | 0 | 1 | 1 | 0 | 1 | 1 | 0 |

*Fig. 4C*

CIRCUITS AND METHODS FOR INITIALIZING MEMORY CELLS

BACKGROUND OF THE INVENTION

1. The Field of the Invention

The present invention relates to the field of initializing memory. In particular, the present invention relates to circuits and methods for initializing the memory cells of a random access memory array to specified values.

2. Background and Related Art

Random access memory cells are used in a variety of computing products including personal computers and field programmable gate arrays. Random access memory cells are beneficial in such devices because data stored in the memory cells is easily overwritten and updated when the operating conditions of a device change or need to change.

Typically, random access memory is arranged as an array of memory cells that include multiple columns of memory cells. Writes to a random access memory cell are accomplished through one or more write ports or one or more read/write ports. A write or read/write port may use either singled ended or differential signaling.

In single ended signaling, a specified binary value is written to a random access memory cell by asserting the specified binary value on a single bit line attached to the write port of the memory cell. When the memory cell is write enabled, data on the single bit line is written into the memory cell. For instance if the value on the attached bit line is a binary zero when the memory cell is write enabled, a binary zero will be written into the memory cell.

In differential ended signaling, a write occurs in a random access memory cell using two bit lines. One bit line, designated as the "true" bit line, is coupled to one side of the memory cell and is driven to the logic value that will be written to the memory cell. The other bit line, designated as the "inverted" bit line, is coupled to the other side of the memory cell and is driven to a logic value that is opposite of the logic value to be written to the memory cell. Transistors are typically used in this type of memory cell. A write is accomplished by overdriving one or both sides of the memory cell through write enable logic thus causing the true and inverted sides of the memory cell to assume the logic levels asserted on the true and inverted bit lines. This results in the value carried on the true bit line being stored in the memory cell.

When using one or more columns of memory, a separate bit line or separate bit lines may be used for each column in the array. Each memory cell in a column may be coupled to the bit line or bit lines associated with the column, from which the memory cell may read and write data. Addressing logic is used to put individual memory cells in a state to read a value from or write a value to an associated bit line or differential pair.

When using random access memory, there are instances when it is beneficial to initialize all the memory cells of a memory array to predetermined values. For instance, part of the production process of random access memory cells involves testing the memory cells to see if they correctly store data. Each memory cell in a memory array must be able to correctly store a binary zero and a binary one. One approach is to sequentially write one binary value to the cells of a memory array a word at a time, read the values back to verify they are correct, then sequentially write the opposite binary value to the same memory cells a word at a time and read back the values to verify they are correct.

Another example of such testing is to write random bit patterns to a memory array. This is often done by writing a random pattern of zeroes and ones to the memory array, and then reading back the values stored each memory cell of the array to see if the values were stored correctly. Next, the inverse of the initial pattern is written to the memory array and each memory cell is again read to see if it stored the correct value. Using both sequentially writes and random bit patterns are time consuming because multiple write operations must be performed to test an array of memory.

As a result, other initialization methods, which reduce the time required to write values to the memory cells of a memory array, have been developed. One method is to add additional transistors to each memory cell. The additional transistors function to initialize each memory cell to a predetermined value upon power up. Thus, binary values are stored in all memory cells simultaneously. This increases the efficiency of the testing process by reducing the number of write operations. However, adding transistors to the memory cells of a memory array may increase the size of the memory array by more than 20% over the size of a similar array that does not include additional transistors.

Therefore, what are desired are circuits and methods for efficiently initializing a random access memory cells in a manner that does not require substantially increasing the size of associated memory arrays.

SUMMARY OF THE INVENTION

In accordance with the present invention, what are described are the structure and operation of a circuit that initializes the cells of a random access memory array. The circuit initializes all memory cells substantially simultaneously but does not substantially increase the overall size of the memory array. In one embodiment, the initialization circuitry does not affect the normal read and write operations of the memory array.

The memory initialization circuit includes an initialization input line, duplicated bit lines, and logic components. In the case of a memory array, which employs single ended memory cells, each memory cell is associated with a single bit line. In the case of a memory array, which includes multiple columns, a single bit line may serve a column of memory cells. In accordance with the present invention, instead of the single bit line, there are two bit lines associated with the column of memory cells even though single ended signaling is employed. Both of the bit lines run the length of the column of memory cells. At the time of manufacture each memory cell is coupled to one of the bit lines.

In the case of memory cells using differential signaling, each memory cell is associated with two bit lines. One is designated as the true bit -line and the other is designated as the inverted bit line. The binary value asserted on the true bit line is considered to be the logic value of the differential pair. In the present invention, both the true bit line and the inverted bit line are duplicated. One differential pair includes one of the true bit lines and one of the inverted bit lines, and the other differential pair includes the other true bit line and the other inverted bit line. This results in four bit lines being available to each memory cell. Included logic components may be used to address all memory cells simultaneously and may be used to force one differential pair to one logic value and the other differential pair to an opposite binary value. At the time of manufacture, each memory cell is coupled to either one or the other differential pair.

In operation, since each memory cell is coupled to only one bit line or to only one differential pair at the time of manufacture, and since each duplicated bit line or differential pair carries an opposite value, the memory cells of a memory array may be initialized to a predetermined pattern. After initialization, that is once the signal indicative of initialization is no longer carried on the initialization input, each duplicated bit line and each differential pair carries an identical value. Thus, after initialization, write operations occur as they would without duplication of any bit lines.

If a memory array using single ended memory cells is configured in columns, conventionally one bit line is used for each column. In this case, the bit line associated with each column would be duplicated and each memory cell in a column coupled to one or the other of the duplicated bit lines. During memory initialization one bit line for each column is forced to a logic zero and the other is forced to a logic one. Memory cells that are to be initialized to a logic zero are coupled at the time of manufacture to the bit line that is forced to a logic zero. Memory cells that are to be initialized to a logic one are coupled at the time of manufacture to the bit line that is forced to logic one. The write control logic is modified so that all write enable signals are asserted simultaneously during memory initialization.

If a memory array using differential memory cells is configured in columns, conventionally a true bit line and an inverted bit line is associated with each column. In the present invention each column would be associated with two differential pairs, each differential pair including one true bit line and one inverted bit line. One differential pair would be set to a logic one and the other to a logic zero. At the time of manufacture, each memory cell is coupled to only one differential pair. Thus, each cell may be initialized to either a logic zero or logic one depending on which differential pair the cell is coupled to. After initialization, both differential pairs carry identical values. Thus, writes occur as they normally would after initialization is complete.

Thus, the memory cells of a memory array, whether employing single ended or differential signaling, may be initialized to predetermined values substantially simultaneously. This reduces the time required to write values to the memory cells of an array, which may decrease the time needed to test random access memory cells. Furthermore, the space required for duplicating bit lines and additional addressing logic is minimal when compared to prior art methods which require the addition of transistors to each memory cell. This reduces manufacturing costs.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 4C is a truth table, which illustrates the relationships between the bit lines, included in FIG. 3, the input lines, included in FIGS. 4a and 4b, and the output lines, included in FIGS. 3, 4A, and 4B.

DETAILED DESCRIPTION OF THE INVENTION

The present invention relates to circuits and methods for initializing the memory cells included in a memory array. Although specific circuits are described herein, those skilled in the art will recognize, given the teaching of this description, that various modifications and additions may also be made that will implement the principles of the present invention. It is intended that the present invention embrace all such modifications and additions.

Figure 5:
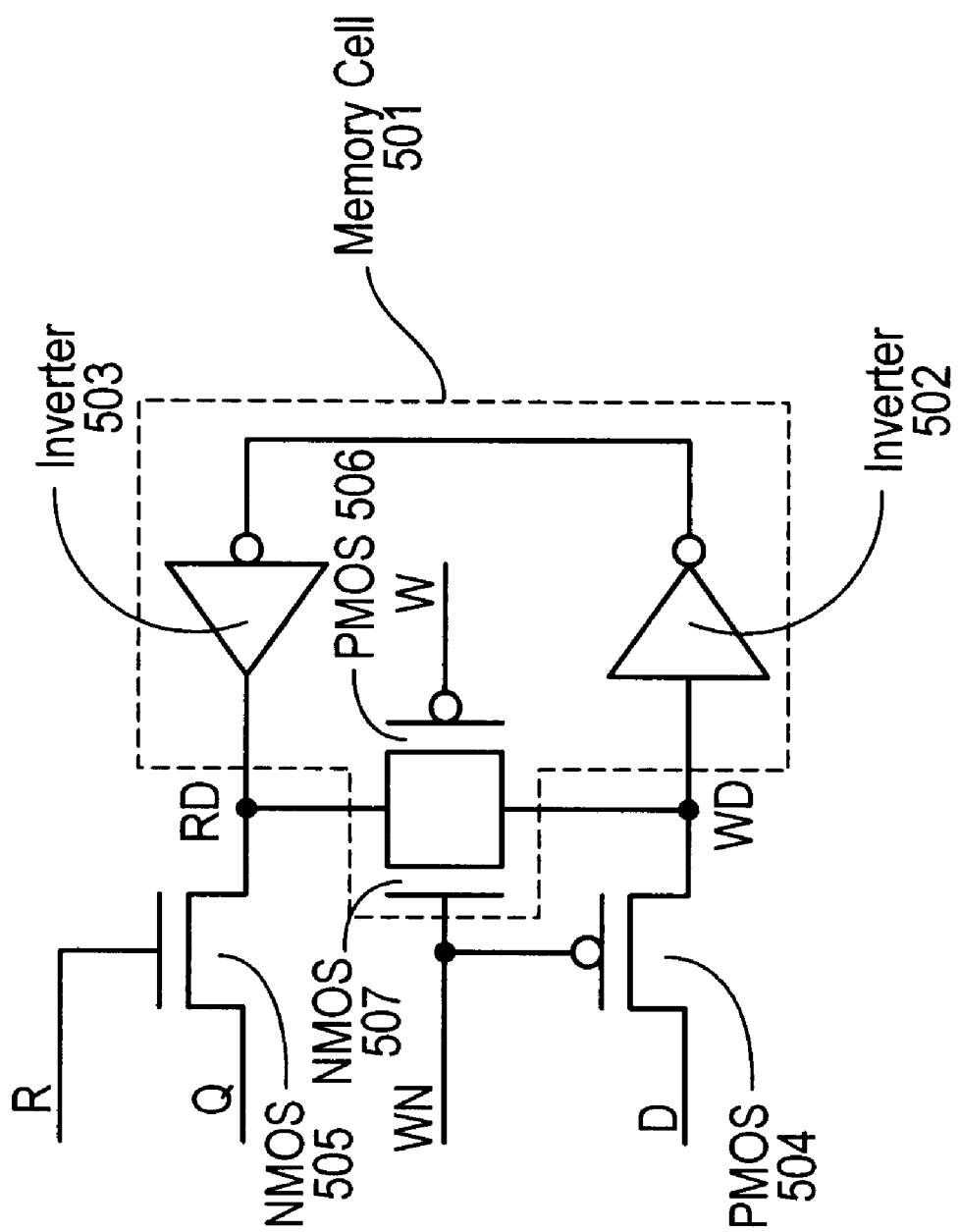
FIG. 5 illustrates an example of a single ended write memory cell and associated logic circuitry.

Illustrated in FIG. 5 is a single ended write memory cell 501 and associated logic circuitry. The memory cell 501 may store one bit of data. Illustrated in FIG. 5 are PMOS transistors 504 and 506, and NMOS transistors 505 and 507. Simply stated, PMOS transistors conduct when their gate terminal is low and NMOS transistors conduct when their gate terminal is high. For purposes of the discussion of FIG. 5, low will be defined as a logic zero and high will be defined as logic one. Those skilled in the art will recognize that low or high values may be assigned in a variety of manners.

In operation, when the WN signal in FIG. 5 is low and the W signal in FIG. 5 is high, the logic value signal D will be written to, or stored in memory cell 501. This is because PMOS transistor 504 will conduct and close the circuit to node WD, which represents the write data terminal of memory cell 501. Conversely, when signal R is high, the value stored in memory cell 501 will be output as signal Q. This is because NMOS transistor 505 will conduct and close the circuit to node RD, which represents the read data terminal of memory cell 501. Inverter 502 and Inverter 503 form the memory cell when connected by NMOS transistor 507 and PMOS transistor 506.

Figure 1:
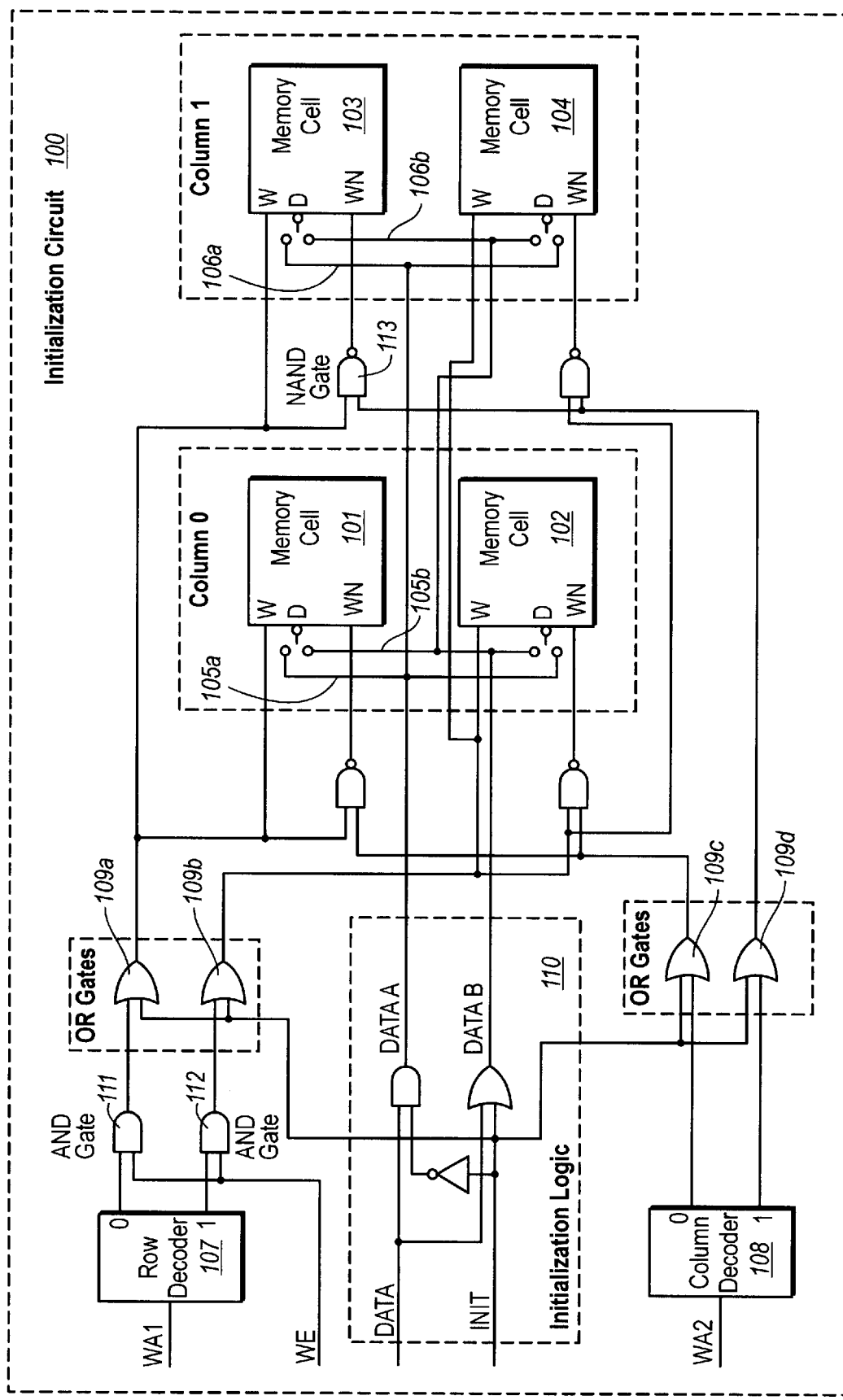
FIG. 1 illustrates a memory circuit with memory cells that employ single ended signaling, and initialization logic in which all the memory cells of the memory circuit may be initialized to binary values simultaneously.

FIG. 1 illustrates an embodiment of a random access memory initialization circuit 100 in accordance with the present invention. Included in FIG. 1 is a four word by one bit memory array. The memory cells included in FIG. 1 may be substantially similar to memory cell 501. However, in FIG. 1 some signal lines unimportant to the principles of the present invention are not illustrated so as to make the figure more readable.

Although the array includes two columns and each column includes two memory cells, the array is properly described in the industry as a four word by one bit memory array. This is because the two address bits WA1 and WA2 are decoded to form four unique address select signals, each of which controls one of the four memory cells thus making a four word memory. The DATA signal is the source of data for all four memory cells making the memory one bit wide. A four word by one bit memory array is shown for illustrative purposes and, as those skilled in the art will realize, a typical memory array is much larger. However, to avoid obscuring the principles of the present invention, a smaller four word by one bit array is shown.

Initialization circuit 100 includes initialization logic 110 and a four word by one bit array of memory cells including memory cells 101, 102, 103, and 104. Each memory cell includes a write ("W") port, a data ("D") port, and a write not ("WN") port. Initialization circuit 100 also includes row decoder 107 and column decoder 108.

For a data value to be written to a memory cell, the W port and WN port must be set to opposite logic values. For example, to successfully write a value to a memory cell included in initialization circuit 100, the value asserted on the W port of a memory cell may be logic one and the value on the WN port may be a logic zero. Only under these circumstances may the binary value asserted on the D port of a memory cell be written to the memory cell. Although the memory cell array of FIG. 1 is used as an example, the principles of the present invention may apply to other memory cell types as will be apparent to those skilled in the art after having reviewed this description.

Referring to FIG. 1, a signal INIT is shown as an input to initialization logic 110. Initialization circuit 100 may operate in one of two different ways depending on the value of the INIT signal. When the INIT signal is not a value indicative of initialization, the memory cells of FIG. 1 may perform normal read and write operations. However, when the INIT signal is carrying a value indicative of initialization, the memory cells in FIG. 1 may be forced to predetermined initialization values.

The value of the INIT signal that indicates initialization may be any voltage used to drive the logic gates in FIG. 1. For illustrative purposes only, discussion of such initialization will assume that the presence of the initialization voltage represents a logic one and that absence of the initialization voltage represents a logic zero. However, to those skilled in the art it will be recognized that these values may be reversed or that voltages other than those representing logic values may be used for initialization. Operation of initialization circuit 100 will now be described when the INIT signal is a logic zero and when the INIT signal is a logic one.

When the INIT signal is a logic zero, row decoder 107, column decoder 108, and their associated logic components control the logic values asserted at the W and WN ports of each memory cell. Thus, when the INIT signal is not a value indicative of initialization, normal read and write operations are possible. That is, memory cell addressing occurs as if the initialization circuitry was not included in FIG. 1. For example, when the INIT signal is low, memory cell 103 may be put in a state to receive a write when row decoder 107 and column decoder 108 address memory cell 103 in a conventional manner.

To write a value to memory cell 103 under normal conditions, several things may occur. The WE, or write enable, signal equals a value indicative of a write occurring. This may typically mean that the WE is a logic one. Also, row decoder 107 receives a logic value WA1 that represents the row of the memory cell that is to be addressed. This causes port 0 of row decoder 107 to carry a logic one thereby representing the addressing of row 0. The values of WE and of the output from Port 0 of row decoder 107 are then received as inputs by AND gate 111. Since both input values are a logic one, the output terminal of AND gate 111 will also be a logic one. This value is then received as an input by OR gate 109a. This causes the output terminal of the OR gate to also carry a logic one, which is then received as an input by the W port on memory cell 103. Since the value is a logic one, the W port on memory cell 103 is put in a state to perform a write operation.

At substantially the same time, column decoder 108 receives the logic value WA2 that represents the column of the memory cell that is to be addressed. This causes port 1 of column decoder 108 to carry a logic one thereby representing the addressing of column 1. The logic one asserted on Port 1 is received as an input by OR gate 109d. Since the value is a logic one, this causes the output of OR gate 109d to also be a logic one. The output from OR gates 109a and 109d are then asserted as inputs to NAND gate 113. Since both values are a logic one, the output of NAND gate 113 is a logic zero. This logic zero is received as an input by the WN port of memory cell 103. Since the value is a logic zero, the WN port on memory cell 103 is put in a state to perform a write operation.

When the W port and the WN port of memory cell 103 are simultaneously in a state to receive a write, the D port of memory cell 103 may assume the value of an associated DATA signal. In FIG. 1, this may be signal DATA A or signal DATA B.

Next, the operation of the memory array in FIG. 1 will be described when the INIT signal is a logic one, which is indicative initialization. When the INIT signal is a logic one, initialization logic 110 forces the DATA A and DATA B signals to opposite logic values. A more detailed view of initialization logic 110 is illustrated in FIG. 2A.

Figure 2:
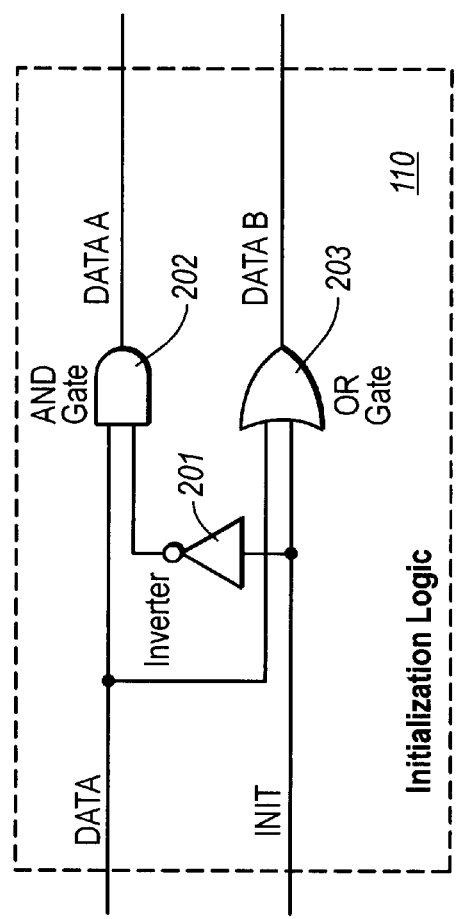
FIG. 2A illustrates an example of a logic circuit that includes components used to initialize a memory array of memory cells employing single ended signaling.
FIG. 2B is a truth table, which illustrates the relationships between signal values of the inputs and outputs of the circuit illustrated in FIG. 2A.

As shown in FIG. 2A, the value of the INIT signal is asserted as an input to OR gate 203 and as an input to Inverter 201. The output of Inverter 201 is asserted as an input to AND gate 202. When the INIT signal is a logic one the output of OR gate 203 will be a logic one and thus DATA B will be a logic one. Since the output of OR gate 203 will be a logic one if either of its inputs is a logic one, the value of the DATA signal does not change the output of OR gate 203. Likewise, the value of the DATA signal does not change the value carried on DATA A. Since AND gate 202 receives the inverted value of the INIT signal, and this is a logic zero, the output of AND gate 202 is forced to a logic zero.

In this description, reference will be made to truth tables to help illustrate some of the embodiments of the present invention. Symbols included in these truth tables have the following meanings: "0" is representative of a logic zero, "1" is representative of a logic one, "X" is representative of a value that does not effect a particular implementation of the present invention, "M" is representative of a value at the true side of a memory cell, "MN" is representative of a value at the inverted side of a memory cell. Truth tables may include some or all of the symbols.

Illustrated in FIG. 2B is a truth table representative of the operation of the initialization logic in Figure in FIG. 2A. As shown by the truth table in FIG. 2B, when the INIT signal is a logic one the output signals DATA A and DATA B are forced to opposite logic values. The value of the DATA signal has no effect on the signals DATA A and DATA B when INIT is a logic one. When INIT is a logic one, a logic one will always be input to OR gate 203 and a logic zero will always be input to AND gate 202, resulting in DATA A being a logic zero and DATA B being a logic one.

Also shown in FIG. 1 are OR gates 109a through 109d. Each of these OR gates receive INIT as an input. When INIT is a logic one, the outputs of these OR gates assert values on the W and WN ports of each memory cell forcing each memory cell into a state where a value may be written to the cells. Thus, all memory cells may be initialized simultaneously.

After initialization, when the INIT signal is no longer a logic one, the memory cells function as if no duplicated data lines were included in the circuit. As shown in FIG. 2B, when INIT is a logic zero, both DATA A and DATA B equal the value of DATA. Thus, it makes no difference what data line the D ports of the memory cells are coupled to, because DATA A and DATA B are always equivalent after initialization.

In FIG. 1, none of the D ports are actually shown as coupled to either DATA A or DATA B. This is to emphasize that each data port may be coupled to either bit line. For example, the memory cells included in column 0 of the memory array may each be coupled to either bit line 105a or bit line 105b and the memory cells included in column 1, which includes memory cell 103, may each be coupled to either of bit line 106a or bit line 106b. The value written to a memory cell during initialization is determined by which bit line the memory cell is coupled to via its D port. Thus, given knowledge of the desired initialization pattern, the memory cell array may be patterned appropriately at the time of manufacture.

Figure 3:
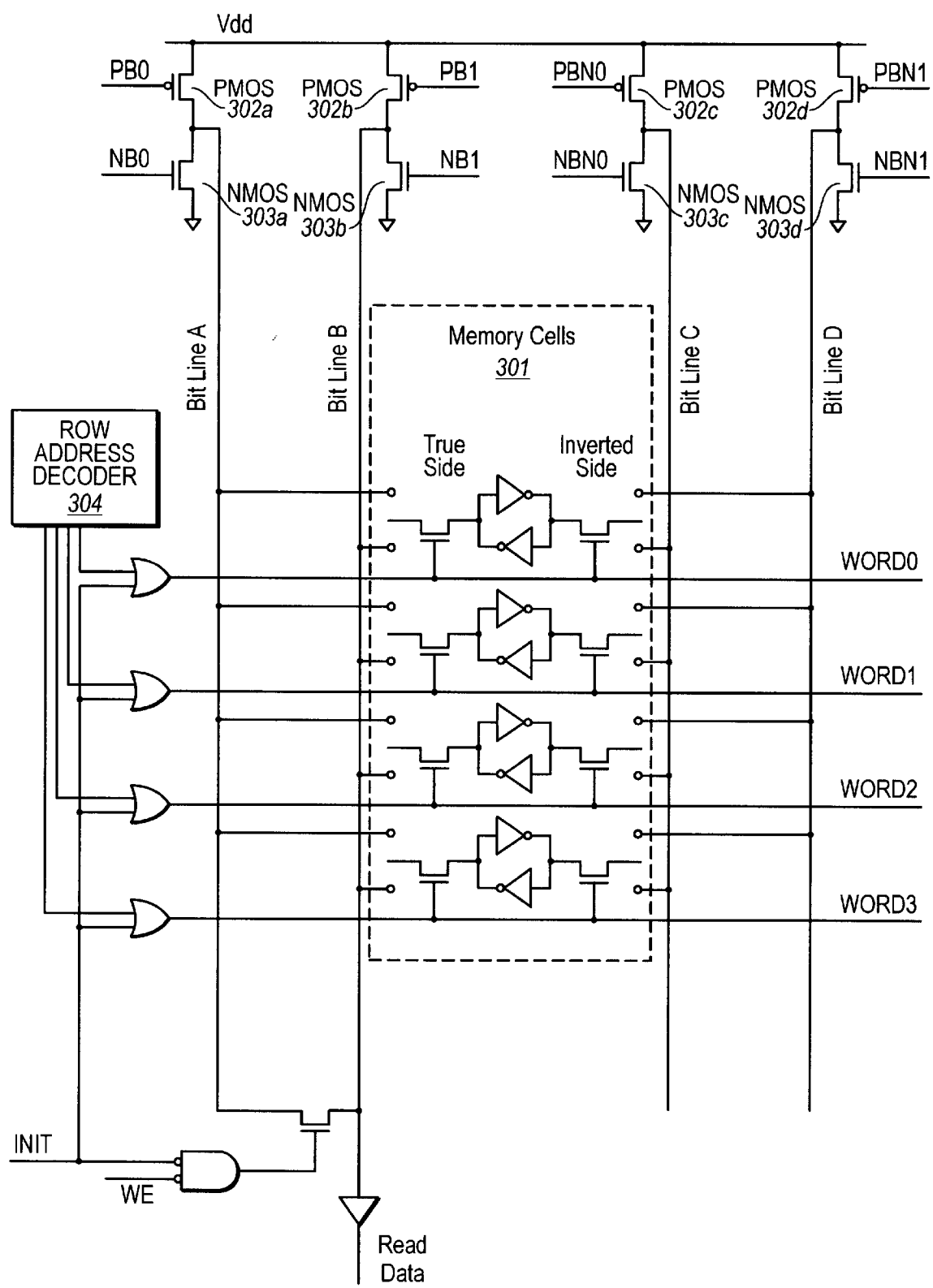
FIG. 3 illustrates a memory circuit with memory cells that employ differential signaling.

FIG. 3 illustrates an example of a memory circuit that includes memory cells employing differential signaling. Included in the circuit, are bit lines A, B, C, and D. Bit lines A and B are duplicated versions of what would be the true bit line and bit lines C and D are duplicated versions of what would be the inverted bit line. The bit lines are driven by PMOS transistors 302a, 302b, 302c, and 302d and NMOS transistors 303a, 303b, 303c, and 303d.

As stated earlier, PMOS transistors conduct when their gate terminal is low and NMOS transistors conduct when their gate terminal is high. For purposes of the discussion of FIGS. 3, 4A, 4B, and 4C, low will be defined as a logic zero and high will be defined as a logic one. Those skilled in the art will recognize that a logic zero or a logic one may be achieved in a variety of methods and that other values may be asserted on the gate terminals of such transistors to achieve the same effect.

Figure 4A:
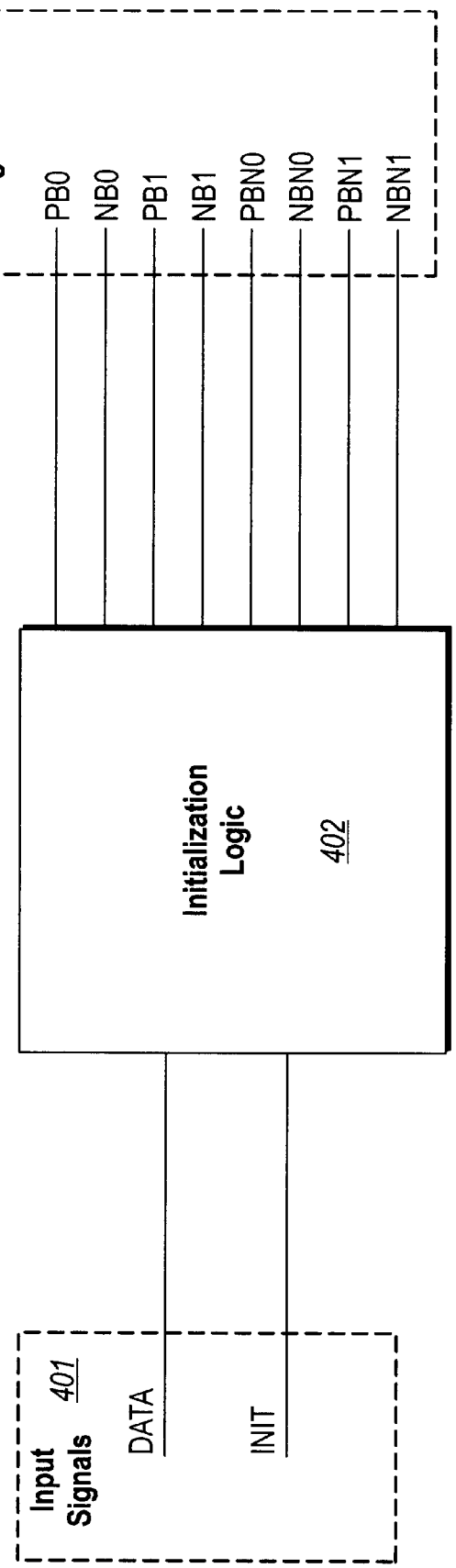
FIG. 4A illustrates an example of the inputs and outputs that may be employed to initialize all the memory cells included in FIG. 3 simultaneously.

The values asserted on the gate terminals of the transistors are generated from an initialization circuit. Shown in FIG. 4A is a generalized illustration of such an initialization circuit. Included in FIG. 4A are input signals 401, initialization logic 402, and output signals 403. Each of the output signals included in output signals 403 drives the gate terminal of a corresponding transistor included in FIG. 3. The logic values of the output signals of FIG. 4A may be varied so as to cause different transistors in FIG. 3 to conduct or not conduct. For instance to cause bit line A to carry a logic zero, output signal PB0 and NB0 would both carry a logic one. This would cause NMOS 303a to conduct, and at substantially the same time, prevent PMOS 302a from conducting. Since NMOS 303a is coupled to low voltage, or logic zero, this value would be carried onto bit line A.

Figure 4B:
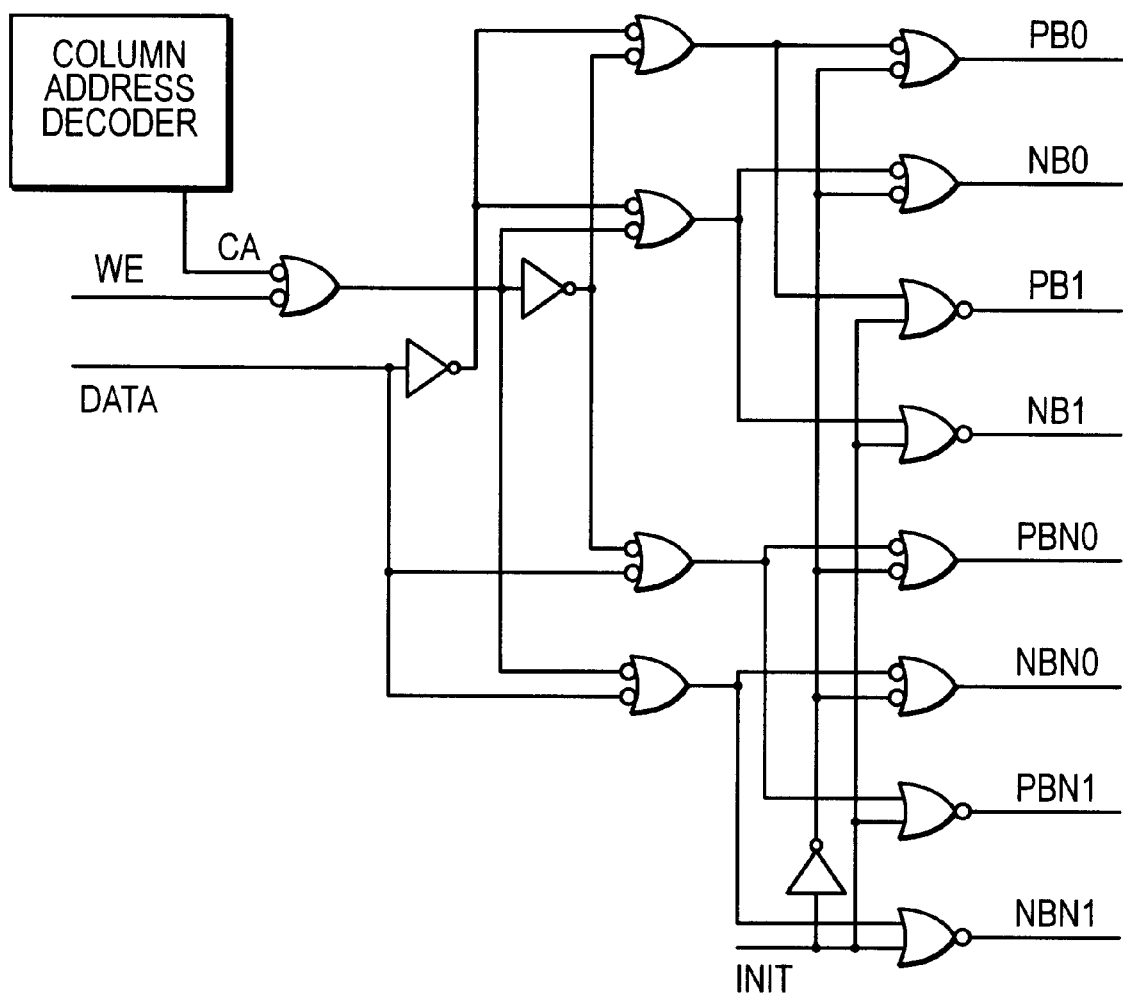
FIG. 4B illustrates one embodiment of a circuit that may be employed to initialize the memory cells in FIG. 3 simultaneously.

During initialization, for example when the value of the INIT signal is a logic one and a logic one is the value that triggers initialization, the output signals shown in FIG. 4A, and corresponding gate terminals in FIG. 3, are all forced to certain values. These values cause bit line A to carry a logic zero, bit line B to carry a logic one, bit line C to carry a logic one, and bit line D to carry a logic zero. FIG. 4B illustrates a specific embodiment of a circuit that includes the functionality of initialization logic 402 as discussed in reference to FIG. 4A.

The truth table in FIG. 4C illustrates this functionality. Note that when the INIT signal is a logic one, the value of the DATA signal does not affect the values of the output signals in FIG. 4A or FIG. 4B or the values carried on bit lines in FIG. 3. When the INIT signal is a logic zero, bit line A and bit line B carry a value equal to the DATA signal and bit line C and bit line D carry the logical opposite value of DATA signal.

After initialization, when the INIT signal is no longer a logic one, the memory cells function as if no duplicated data lines were included in FIG. 3. As shown in FIG. 4C, when INIT is a logic zero, bit line A and bit line B carry logic values equal to DATA and bit line C and bit line D carry logic values equal to the opposite of DATA. Thus, whether the true side of a memory cell was coupled to bit line A or bit line B and whether the inverted side of the memory cell was coupled to bit line C or bit line D makes no difference after initialization. Therefore, after initialization, the circuit functions like conventional differential random access memory.

In FIG. 3, none of the terminals of the memory cells are actually shown as coupled to any bit lines. This is to emphasize that the true side may be coupled to either bit line A or bit line B and that the inverted side may be coupled to either bit line C or bit line D. For example, to initialize a memory cell to a logic one, the true side of the memory cell may be coupled to bit line A and the inverted side the same memory cell coupled to bit line C. Likewise, to initialize a memory cell to a logic zero, the true side of the memory cell may be coupled to bit line B and the inverted side of the memory cell coupled to bit line D. Thus, given knowledge of the desired initialization pattern, the memory cells may be patterned appropriately at the time of manufacture.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired to be secured by United States Letters Patent is:

1. A random access memory circuit in which an initialization circuit initializes the memory cells of the random access memory to a predetermined value, the random access memory initialization circuit comprising the following:

a first bit line corresponding to a column of memory cells;

a second bit line physically isolated from the first bit line that also corresponds to the column of memory cells;

the column of memory cells including a plurality of memory cells each having a write terminal for writing a binary value to the corresponding memory cell, the write terminals of a first group of one or more of the plurality of memory cells being physically connected to the first bit line, the write terminals of a second group of one or more of the plurality of memory cells being physically connected to the second bit line; and an initialization circuit having an initialization input, the initialization circuit coupled directly or indirectly to the first bit line and the second bit line such that when the initialization input carries a signal state indicative of an initialization, the initialization circuit causes the first bit line and second bit line to carry predetermined binary opposite values, wherein during initialization, each of the first group of memory cells is initialized to a first binary value while each of the second group of memory cells is initialized to a second binary value that is opposite the first binary value.

2. A random access memory circuit as recited in claim 1, wherein the initialization circuit comprises:
   a data input line;
   an initialization input line;
   a first output line coupled to the first bit line; and
   a second output line coupled to the second bit line, wherein the initialization circuit is configured to carry binary opposites on the first output line and second output line when the signal state indicative of initialization is carried on the initialization input line, and wherein the binary values carried on the first output line and second output line are equal to the binary value carried on the data input line when a signal state not indicative of initialization is carried on the initialization input line.

3. A random access memory circuit as recited in claim 2, wherein the initialization circuit comprises the following:
   an AND gate having a first input terminal, a second input terminal, and an output terminal;
   an OR gate having a first input terminal, a second input terminal, and an output terminal;
   an inverter having an input terminal and an output terminal, wherein the initialization input line is coupled to the input terminal of the inverter and to the first input terminal of the OR gate, wherein the output terminal of the inverter is coupled to the first input terminal of the AND gate, wherein the data input line is coupled to the second input terminal of the OR gate and to the second input terminal of the AND gate, wherein the output terminal of the AND gate is coupled to the first output line, and wherein the output terminal of the OR gate is coupled to the second output line.

4. A random access memory circuit in which an initialization circuit initializes the memory cells of the random access memory to a predetermined value, the random access memory initialization circuit comprising the following:
   a first bit line corresponding to a column of memory cells;
   a second bit line corresponding to the column of memory cells;
   a third bit line corresponding to the column of memory cells;
   a fourth bit line corresponding to the column of memory cells;
   the column of memory cells including a plurality of memory cells each having a differential write terminal for writing a binary value to the corresponding memory cell, the differential write terminal of a first group of one or more of the plurality of memory cells being physically connected to the first bit line and the third bit line, the differential write terminal of a second group of one or more of the plurality of memory cells being physically connected to the second bit line and the fourth bit line; and an initialization circuit having an initialization input, the initialization circuit coupled directly or indirectly to the first bit line, the second bit line, the third bit line, and the fourth bit line such that when the initialization input carries a signal state indicative of an initialization, the initialization circuit causes the first bit line and the second bit line to carry predetermined binary opposite values, causes the third bit line to carry a predetermined binary value equal to the second bit line, and causes the fourth bit line to carry predetermined binary value equal to the first bit line, wherein during initialization, each of the first group of memory cells is initialized to a first binary value and each of the second group of memory cells is initialized to a second binary value that is opposite the second binary value.

5. A random access memory circuit as recited in claim 4, wherein the initialization circuit comprises:
   an initialization input line;
   a write enable input line;
   a row address decoder input line;
   a first PMOS transistor with a gate terminal, a source terminal coupled to high voltage source, and a drain terminal coupled to the first bit line;
   a first NMOS transistor with a gate terminal, a drain terminal coupled to the first bit line, and a source terminal coupled to a low voltage source;
   a second PMOS transistor with a gate terminal, a source terminal coupled to the high voltage source, and a drain terminal coupled to the second bit line;
   a second NMOS transistor with a gate terminal, a drain terminal coupled to the second bit line, and a source terminal coupled to the low voltage source;
   a third PMOS transistor with a gate terminal, a source terminal coupled to the high voltage source, and a drain terminal coupled to the third bit line;
   a third NMOS transistor with a gate terminal, a source terminal coupled to the third bit line, and a drain terminal coupled to the low voltage source;
   a fourth PMOS transistor with a gate terminal, a source terminal coupled to the high voltage source, and a drain terminal coupled to the fourth bit line; and
   a fourth NMOS transistor with a gate terminal, a drain terminal coupled to the fourth bit line and a source terminal coupled to the low voltage source, wherein the transistors are configured so that binary opposites are carried on the first bit line and the second bit line, the third bit line carries a binary value equal to the binary value on the second bit line, and the fourth bit line carries a binary value equal to the binary value on the first bit line, when the signal state indicative of initialization is carried on the initialization input line and wherein the transistors are configured so that an identical binary value is carried on the first and second bit lines and the binary opposite of the value carried on the first and second bit lines is carried on the third and fourth bit lines, when a signal state not indicative of initialization is carried on the initialization input line.

6. A random access memory circuit as recited in claim 5, wherein the initialization circuit comprises:
   a data input line;
   a column address decoder input;
   a first output line coupled to the gate terminal of the first PMOS transistor;
   a second output line coupled to the gate terminal of the first NMOS transistor;

a third output line coupled to the gate terminal of the second PMOS transistor;

a fourth output line coupled to the gate terminal of the second NMOS transistor;

a fifth output line coupled to the gate terminal of the third PMOS transistor;

a sixth output line coupled to the gate terminal of the third NMOS transistor;

a seventh output line coupled to the gate terminal of the fourth PMOS transistor; and an eighth output line coupled to the gate terminal of the fourth NMOS transistor, wherein the values carried on the first and second output lines cause the first NMOS and first PMOS transistors to act together resulting in the assertion of a binary value on the first bit line, the values carried on the third and fourth output lines cause the second NMOS and second PMOS transistor to act together resulting in the assertion of a binary value on the second bit line which is the binary opposite of the binary value asserted on the first bit line, the fifth and sixth output lines cause the third NMOS and third PMOS transistor to act together resulting in the assertion of a binary on the third bit line equal to the binary value asserted on the second bit line, the seventh and eighth bit lines cause the fourth NMOS and fourth NMOS transistor to act together resulting in the assertion of a binary value on the fourth bit line equal to the binary value asserted on the first bit line, when the signal state indicative of initialization is carried on the initialization input line and wherein the first and second bit lines carry the binary value asserted on the data input line and the third and fourth bit lines carry the binary opposite of the value carried on the data input line when the signal state not indicative of initialization is carried on the initialization input line.

7. A method for initializing a plurality of random access memory cells having a write terminal for writing a binary value to the corresponding memory cell, in which an initialization circuit initializes the memory cells to predetermined values, the method comprising the following:

asserting a voltage on an initialization input of the initialization circuit, the initialization circuit being coupled directly or indirectly to a first bit line and a second bit line physically isolated from the first bit line;

in response to the asserting of the voltage on the initialization input, carrying on the first bit line a first binary value;

in response to the asserting of the voltage on the initialization input, carrying on the second bit line a second binary value that is opposite the first binary value;

setting a first group of one or more memory cells coupled to the first bit line to the binary value carried on the first bit line; and setting a second group of one or more memory cells coupled to the second bit line to the binary value carried on the second bit line.

8. The method as recited in claim 7, further comprising:

deasserting the asserted voltage from the initialization input;

asserting a data voltage on a data input line; and causing the voltage on the first bit line and the voltage on the second bit line to equal the data voltage.

9. The method as recited in claim 7, wherein setting a first group of one or more memory cells coupled to the first bit line comprises the following:

setting each memory cell in the first group of one or more memory cells coupled to the first bit line to the value carried on the first bit line substantially simultaneously.

10. The method as recited in claim 9, wherein setting each memory cell in the second group of one or more memory cells coupled to the second bit line comprises the following:

setting each memory cell in the second group of one or more memory cells coupled to the second bit line to the value carried on the second bit line substantially simultaneously.

11. The method as recited in claim 10, wherein each memory cell in the first group of one or more memory cells and each memory cell in the second group of one or more cells are set substantially simultaneously to each other.

12. A method for initializing a plurality of random access memory cells each having a differential write terminal for writing a binary value to the corresponding memory cell, in which an initialization circuit initializes the memory cells to predetermined values, the method comprising the following:

asserting a voltage on an initialization input of the initialization circuit, which is coupled directly or indirectly to a first bit line, a second bit line, a third bit line and a fourth bit line;

in response to the asserting of the voltage on the initialization input, carrying on the first bit line a first binary value;

in response to the asserting of the voltage on the initialization input, carrying on the second bit line a second binary value that is opposite the first binary value;

in response to the asserting of the voltage on the initialization input, carrying on a third bit line a third binary value equal to the second binary value;

in response to the asserting of the voltage on the initialization input, carrying on a fourth bit line a fourth binary value equal to the first binary value;

setting a first group of one or more memory cells coupled to the first bit line and to the third bit line to a first predetermined binary value; and setting a second group of one or more memory cells coupled to the second bit line and the fourth bit line to a second predetermined binary value.

13. The method as recited in claim 12, further comprising:

deasserting the asserted voltage from the initialization input;

asserting a data voltage on a data input on a data input line; and causing the voltage on the first bit line and the second bit line to equal the data voltage; and causing the voltage on the third and fourth bit lines to equal a voltage representing the binary opposite of the binary value represented by the data voltage.

14. The method as recited in claim 12, wherein setting a first group of one or more memory cells coupled to the first bit line and to the third bit line to a first predetermined binary value comprises the following:

setting a first group of one or more memory cells coupled to the first bit line and to the third bit line to a first predetermined binary value substantially simultaneously.

15. The method as recited in claim 14, wherein setting a second group of one or more memory cells coupled to the second bit line and the fourth bit line to a second predetermined binary value comprising the following:

setting a second group of one or more memory cells coupled to the second bit line and the fourth bit line to a second predetermined binary value substantially simultaneously.

16. The method as recited in claim 15, wherein each memory cell in the first group of one or more memory cells and each memory cell in the second group of one or more memory cells are set substantially simultaneously to each other.

* * * * *

UNITED STATES PATENT AND TRADEMARK OFFICE
CERTIFICATE OF CORRECTION

PATENT NO. : 6,519,177 B1  
DATED : February 11, 2003  
INVENTOR(S) : James Robert Brown It is certified that error appears in the above-identified patent and that said Letters Patent is hereby corrected as shown below:

Column 2,
Line 52, before "line" delete "-"

Column 6,
Line 65, delete "in Figure"

Column 7,
Line 14, change "A" to -- a --

Column 10,
Line 22, after "high" insert -- a --

Column 11,
Line 26, change "NMOS" to -- PMOS --

Signed and Sealed this

Twenty-third Day of September, 2003

JAMES E. ROGAN
*Director of the United States Patent and Trademark Office*